US009593871B2

(12) United States Patent
Stanley et al.

(10) Patent No.: US 9,593,871 B2
(45) Date of Patent: Mar. 14, 2017

(54) SYSTEMS AND METHODS FOR OPERATING A THERMOELECTRIC MODULE TO INCREASE EFFICIENCY

(71) Applicant: Phononic Devices, Inc., Durham, NC (US)

(72) Inventors: Marshall Stanley, Chapel Hill, NC (US); Daniel Barus, Raleigh, NC (US)

(73) Assignee: Phononic Devices, Inc., Durham, NC (US)

( * ) Notice: Subject to any disclaimer, the term of this patent is extended or adjusted under 35 U.S.C. 154(b) by 0 days.

(21) Appl. No.: 14/849,177

(22) Filed: Sep. 9, 2015

(65) Prior Publication Data

US 2016/0018140 A1    Jan. 21, 2016

Related U.S. Application Data

(63) Continuation of application No. PCT/US2015/041388, filed on Jul. 21, 2015.
(Continued)

(51) Int. Cl.
*F25B 21/04* (2006.01)
*H01L 35/34* (2006.01)

(52) U.S. Cl.
CPC .............. *F25B 21/04* (2013.01); *H01L 35/34* (2013.01); *F25B 2321/0212* (2013.01)

(58) Field of Classification Search
CPC ... F25B 21/04; F25B 2321/0212; H01L 35/34
See application file for complete search history.

(56) References Cited

U.S. PATENT DOCUMENTS 2,027,057 A    1/1936  Munters
2,938,357 A    5/1960  Sheckler
(Continued)

FOREIGN PATENT DOCUMENTS

CN    1783461 A       6/2006
CN    100585896 C     1/2010
(Continued)

OTHER PUBLICATIONS

U.S. Appl. No. 13/836,525, filed Mar. 15, 2013.
(Continued)

*Primary Examiner* — Emmanuel Duke
(74) *Attorney, Agent, or Firm* — Withrow & Terranova, PLLC

(57) ABSTRACT

Systems and methods for operating a thermoelectric module to increase efficiency are disclosed. In some embodiments, a method of operating a thermoelectric module includes determining a first amount of power that would maximize a coefficient of performance of the thermoelectric module based on one or more system parameters and providing the first amount of power to the thermoelectric module. The method also includes determining that at least one of the one or more system parameters has changed, determining a second amount of power that would maximize the coefficient of performance of the thermoelectric module based on the one or more system parameters, and providing the second amount of power to the thermoelectric module. In some embodiments, adjusting the amount of power provided based on the one or more system parameters increases the efficiency of the thermoelectric module.

13 Claims, 8 Drawing Sheets

Related U.S. Application Data

(60) Provisional application No. 62/027,080, filed on Jul. 21, 2014, provisional application No. 62/027,083, filed on Jul. 21, 2014.

(56) References Cited

U.S. PATENT DOCUMENTS

| | | |
|---|---|---|
| 2,947,150 A | 8/1960 | Roeder, Jr. |
| 3,100,969 A | 8/1963 | Elfving |
| 3,191,391 A | 6/1965 | Müller |
| 3,196,620 A | 7/1965 | Elfving et al. |
| 3,393,127 A | 7/1968 | Detman et al. |
| 3,532,159 A | 10/1970 | Hammitt et al. |
| 3,621,906 A | 11/1971 | Leffert |
| 3,821,881 A | 7/1974 | Harkias |
| 4,011,104 A | 3/1977 | Basiulis |
| 4,213,448 A | 7/1980 | Hebert |
| 4,278,906 A | 7/1981 | Kullmann |
| 4,306,613 A | 12/1981 | Christopher |
| 4,335,578 A | 6/1982 | Osborn et al. |
| 4,357,932 A | 11/1982 | Stacy |
| 4,366,857 A | 1/1983 | Mayer |
| 4,382,466 A | 5/1983 | Shiraishi |
| 4,383,414 A | 5/1983 | Beitner |
| 4,393,663 A | 7/1983 | Grunes et al. |
| 4,449,377 A | 5/1984 | Draper |
| 4,474,228 A | 10/1984 | Rogalski et al. |
| 4,476,922 A | 10/1984 | Heilig, Jr. et al. |
| 4,498,306 A | 2/1985 | Tyree, Jr. |
| 4,505,261 A | 3/1985 | Hunter |
| 4,513,732 A | 4/1985 | Feldman, Jr. |
| 4,545,364 A | 10/1985 | Maloney |
| 4,546,608 A | 10/1985 | Shiina et al. |
| 4,607,498 A | 8/1986 | Dinh |
| 4,687,048 A | 8/1987 | Edelstein et al. |
| 4,700,771 A | 10/1987 | Bennett et al. |
| 4,796,439 A | 1/1989 | Yamada et al. |
| 4,810,460 A | 3/1989 | Gluntz |
| 4,833,567 A | 5/1989 | Saaski et al. |
| 4,842,050 A | 6/1989 | Harper |
| 4,848,445 A | 7/1989 | Harper |
| 5,000,252 A | 3/1991 | Faghri |
| 5,069,274 A | 12/1991 | Haslett et al. |
| 5,161,090 A | 11/1992 | Crawford et al. |
| 5,190,098 A | 3/1993 | Long |
| 5,195,575 A | 3/1993 | Wylie |
| 5,309,725 A | 5/1994 | Cayce |
| 5,333,677 A | 8/1994 | Molivadas |
| 5,355,678 A | 10/1994 | Beitner |
| 5,384,051 A | 1/1995 | McGinness |
| 5,385,203 A | 1/1995 | Mitsuhashi et al. |
| 5,386,701 A | 2/1995 | Cao |
| 5,400,607 A | 3/1995 | Cayce |
| 5,406,805 A | 4/1995 | Radermacher et al. |
| 5,408,847 A | 4/1995 | Erickson |
| 5,411,077 A | 5/1995 | Tousignant |
| 5,456,081 A | 10/1995 | Chrysler et al. |
| 5,458,189 A | 10/1995 | Larson et al. |
| 5,477,706 A | 12/1995 | Kirol et al. |
| 5,551,244 A | 9/1996 | Bailey |
| 5,558,783 A | 9/1996 | McGuinness |
| 5,579,830 A | 12/1996 | Giammaruti |
| 5,587,880 A | 12/1996 | Phillips et al. |
| 5,596,981 A | 1/1997 | Soucy |
| 5,598,721 A | 2/1997 | Rockenfeller et al. |
| 5,622,057 A | 4/1997 | Bussjager et al. |
| 5,628,205 A | 5/1997 | Rockenfeller et al. |
| 5,647,429 A | 7/1997 | Oktay et al. |
| 5,655,598 A | 8/1997 | Garriss et al. |
| 5,695,007 A | 12/1997 | Fauconnier et al. |
| 5,704,416 A | 1/1998 | Larson et al. |
| 5,737,840 A | 4/1998 | Akachi |
| 5,737,923 A | 4/1998 | Gilley et al. |
| 5,770,903 A | 6/1998 | Bland et al. |
| 5,864,466 A | 1/1999 | Remsburg |
| 5,867,990 A | 2/1999 | Ghoshal |
| 5,890,371 A | 4/1999 | Rajasubramanian et al. |
| 5,931,001 A * | 8/1999 | Watanabe ............. F24F 5/0042 165/54 |
| 5,931,156 A | 8/1999 | Wang et al. |
| 5,966,939 A | 10/1999 | Tauchi |
| 5,970,719 A | 10/1999 | Merritt |
| 6,003,319 A | 12/1999 | Gilley et al. |
| 6,006,998 A | 12/1999 | Rerolle |
| 6,014,968 A | 1/2000 | Teoh |
| 6,019,165 A | 2/2000 | Batchelder |
| 6,021,844 A | 2/2000 | Batchelder |
| 6,055,157 A | 4/2000 | Bartilson |
| RE36,684 E | 5/2000 | Rockenfeller et al. |
| 6,064,572 A | 5/2000 | Remsburg |
| 6,073,888 A | 6/2000 | Gelon et al. |
| 6,097,597 A | 8/2000 | Kobayashi |
| 6,109,044 A | 8/2000 | Porter et al. |
| 6,148,905 A | 11/2000 | Sehmbey |
| 6,158,502 A | 12/2000 | Thomas |
| 6,161,388 A | 12/2000 | Ghoshal |
| 6,167,948 B1 | 1/2001 | Thomas |
| 6,192,979 B1 | 2/2001 | Koch et al. |
| 6,234,242 B1 | 5/2001 | Sehmbey et al. |
| 6,237,223 B1 | 5/2001 | McCullough |
| 6,237,682 B1 | 5/2001 | Bowers et al. |
| 6,294,853 B1 | 9/2001 | Lin et al. |
| 6,314,741 B1 | 11/2001 | Hiraishi |
| 6,345,507 B1 | 2/2002 | Gillen |
| 6,347,521 B1 | 2/2002 | Kadotani et al. |
| 6,360,813 B1 | 3/2002 | Katoh et al. |
| 6,382,309 B1 | 5/2002 | Kroliczek et al. |
| 6,388,882 B1 | 5/2002 | Hoover et al. |
| 6,410,982 B1 | 6/2002 | Brownell et al. |
| 6,418,729 B1 | 7/2002 | Dominguez-Alonso et al. |
| 6,463,743 B1 | 10/2002 | Laliberté |
| 6,499,777 B1 | 12/2002 | Wang |
| 6,533,029 B1 | 3/2003 | Phillips |
| 6,536,510 B2 | 3/2003 | Khrustalev et al. |
| 6,549,408 B2 | 4/2003 | Berchowitz |
| 6,557,354 B1 | 5/2003 | Chu et al. |
| 6,564,860 B1 | 5/2003 | Kroliczek et al. |
| 6,568,857 B1 | 5/2003 | Richard et al. |
| 6,585,039 B2 | 7/2003 | Sagal et al. |
| 6,631,624 B1 | 10/2003 | Kirol et al. |
| 6,631,755 B1 | 10/2003 | Kung et al. |
| 6,642,485 B2 | 11/2003 | Goenka et al. |
| 6,657,121 B2 | 12/2003 | Garner |
| 6,658,857 B1 | 12/2003 | George |
| 6,672,373 B2 | 1/2004 | Smyrnov |
| 6,679,316 B1 | 1/2004 | Lin et al. |
| 6,681,487 B2 | 1/2004 | Sagal et al. |
| 6,698,502 B1 | 3/2004 | Lee |
| 6,739,138 B2 | 5/2004 | Saunders et al. |
| 6,745,830 B2 | 6/2004 | Dinh |
| 6,771,498 B2 | 8/2004 | Wang et al. |
| 6,789,610 B1 | 9/2004 | Hegde |
| 6,804,117 B2 | 10/2004 | Phillips et al. |
| 6,808,011 B2 | 10/2004 | Lindemuth et al. |
| 6,828,675 B2 | 12/2004 | Memory et al. |
| 6,866,092 B1 | 3/2005 | Molivadas |
| 6,889,753 B2 | 5/2005 | Takamizawa et al. |
| 6,889,754 B2 | 5/2005 | Kroliczek et al. |
| 6,972,365 B2 | 12/2005 | Garner |
| 6,994,151 B2 | 2/2006 | Zhou et al. |
| 7,004,240 B1 | 2/2006 | Kroliczek et al. |
| 7,013,955 B2 | 3/2006 | Phillips et al. |
| 7,013,956 B2 | 3/2006 | Thayer et al. |
| 7,032,389 B2 | 4/2006 | Cauchy |
| 7,061,763 B2 | 6/2006 | Tsoi |
| 7,069,975 B1 | 7/2006 | Haws et al. |
| 7,071,408 B2 | 7/2006 | Garner |
| 7,077,189 B1 | 7/2006 | Reyzin et al. |
| 7,096,928 B2 | 8/2006 | Phillips et al. |
| 7,102,267 B2 | 9/2006 | Gromoll et al. |
| 7,124,594 B2 | 10/2006 | McRell |
| 7,127,023 B2 | 10/2006 | Wieland |
| 7,131,484 B2 | 11/2006 | Gayrard et al. |
| 7,143,818 B2 | 12/2006 | Thayer et al. |

(56) References Cited

U.S. PATENT DOCUMENTS

| | | |
|---|---|---|
| 7,156,279 B2 | 1/2007 | Goenke et al. |
| 7,162,878 B2 | 1/2007 | Narayanamurthy et al. |
| 7,174,950 B2 | 2/2007 | Jacqué et al. |
| 7,185,512 B2 | 3/2007 | Badie et al. |
| 7,212,403 B2 | 5/2007 | Rockenfeller |
| 7,212,409 B1 | 5/2007 | Belady et al. |
| 7,215,541 B2 | 5/2007 | Nelson |
| 7,227,749 B2 | 6/2007 | Rockenfeller |
| 7,231,961 B2 | 6/2007 | Alex et al. |
| 7,251,889 B2 | 8/2007 | Kroliczek et al. |
| 7,266,969 B2 | 9/2007 | Hsu et al. |
| 7,266,976 B2 | 9/2007 | Eaton et al. |
| 7,282,678 B2 | 10/2007 | Tung et al. |
| 7,285,802 B2 | 10/2007 | Ouderkirk et al. |
| 7,304,842 B2 | 12/2007 | Yatskov |
| 7,310,971 B2 | 12/2007 | Eaton et al. |
| 7,325,590 B2 | 2/2008 | Kim et al. |
| 7,334,630 B2 | 2/2008 | Goodson et al. |
| 7,380,584 B2 | 6/2008 | Ippoushi et al. |
| 7,406,999 B2 | 8/2008 | Bhatti et al. |
| 7,416,017 B2 | 8/2008 | Haws et al. |
| 7,424,906 B2 | 9/2008 | Bhatti et al. |
| 7,448,222 B2 | 11/2008 | Bormann |
| 7,475,718 B2 | 1/2009 | Reyzin et al. |
| 7,477,516 B2 | 1/2009 | Joshi et al. |
| 7,487,643 B2 | 2/2009 | Chen et al. |
| 7,497,249 B2 | 3/2009 | Bhatti et al. |
| 7,505,268 B2 | 3/2009 | Schick |
| 7,506,682 B2 | 3/2009 | Bhatti et al. |
| 7,509,995 B2 | 3/2009 | Bhatti et al. |
| 7,512,206 B2 | 3/2009 | Wieland |
| 7,520,317 B2 | 4/2009 | Rusch et al. |
| 7,532,467 B2 | 5/2009 | Launay et al. |
| 7,556,086 B2 | 7/2009 | Joshi et al. |
| 7,556,088 B2 | 7/2009 | Joshi et al. |
| 7,556,089 B2 | 7/2009 | Bhatti et al. |
| 7,566,999 B2 | 7/2009 | Neal |
| 7,604,040 B2 | 10/2009 | Ghosh et al. |
| 7,623,350 B2 | 11/2009 | Tien et al. |
| 7,629,716 B2 | 12/2009 | Neal |
| 7,642,644 B2 | 1/2010 | Wilkins et al. |
| 7,644,753 B2 | 1/2010 | Ghosh et al. |
| 7,650,928 B2 | 1/2010 | Bhatti et al. |
| 7,665,511 B2 | 2/2010 | Bhatti et al. |
| 7,683,509 B2 | 3/2010 | Neal |
| 7,708,053 B2 | 5/2010 | Kroliczek et al. |
| 7,770,632 B2 | 8/2010 | Bhatti et al. |
| 7,841,305 B2 | 11/2010 | King et al. |
| 7,841,387 B2 | 11/2010 | Ippoushi et al. |
| 7,854,129 B2 | 12/2010 | Narayanamurthy |
| 7,928,348 B2 | 4/2011 | Neal |
| 7,954,331 B2 * | 6/2011 | Ullman .................. F25B 21/02 62/3.2 |
| 7,958,935 B2 | 6/2011 | Belits et al. |
| 8,016,024 B2 | 9/2011 | Kang et al. |
| 8,033,017 B2 | 10/2011 | Kim et al. |
| 8,066,055 B2 | 11/2011 | Kroliczek et al. |
| 8,109,325 B2 | 2/2012 | Kroliczek et al. |
| 8,136,580 B2 | 3/2012 | Kroliczek et al. |
| 8,213,471 B2 | 7/2012 | Schlie et al. |
| 8,217,557 B2 | 7/2012 | Sills et al. |
| 8,763,408 B2 | 7/2014 | Ma et al. |
| 8,893,513 B2 | 11/2014 | June et al. |
| 8,991,194 B2 | 3/2015 | Edwards et al. |
| 9,103,572 B2 | 8/2015 | Edwards et al. |
| 2001/0023762 A1 | 9/2001 | Sagal |
| 2002/0023456 A1 | 2/2002 | Sone |
| 2002/0038550 A1 | 4/2002 | Gillen |
| 2002/0070486 A1 | 6/2002 | Kim et al. |
| 2003/0029174 A1 | 2/2003 | Lee |
| 2003/0075306 A1 | 4/2003 | Zuo et al. |
| 2003/0111516 A1 | 6/2003 | Ghoshal |
| 2003/0121515 A1 | 7/2003 | Yu-Chu et al. |
| 2003/0159806 A1 | 8/2003 | Sehmbey et al. |
| 2004/0154312 A1 | 8/2004 | Abras |
| 2005/0011199 A1 | 1/2005 | Grisham et al. |
| 2005/0056403 A1 | 3/2005 | Norlin et al. |
| 2005/0061486 A1 | 3/2005 | Yang |
| 2005/0091989 A1 | 5/2005 | Leija et al. |
| 2005/0172644 A1 | 8/2005 | Zhang et al. |
| 2005/0257532 A1 | 11/2005 | Ikeda et al. |
| 2006/0088746 A1 | 4/2006 | Tuma et al. |
| 2006/0108097 A1 | 5/2006 | Hodes et al. |
| 2006/0162903 A1 | 7/2006 | Bhatti et al. |
| 2006/0254753 A1 | 11/2006 | Phillips et al. |
| 2007/0028626 A1 | 2/2007 | Chen |
| 2007/0028955 A1 | 2/2007 | Sogou et al. |
| 2007/0101730 A1 | 5/2007 | Chen et al. |
| 2007/0227701 A1 | 10/2007 | Bhatti et al. |
| 2007/0227703 A1 | 10/2007 | Bhatti et al. |
| 2007/0246193 A1 | 10/2007 | Bhatti et al. |
| 2007/0246195 A1 | 10/2007 | Bhatti et al. |
| 2007/0256427 A1 | 11/2007 | Tateyama et al. |
| 2007/0267180 A1 | 11/2007 | Asfia et al. |
| 2008/0012436 A1 | 1/2008 | Neal |
| 2008/0013283 A1 | 1/2008 | Gilbert et al. |
| 2008/0022696 A1 | 1/2008 | Welle et al. |
| 2008/0047692 A1 | 2/2008 | Weinstein |
| 2008/0049384 A1 | 2/2008 | Unternaehrer et al. |
| 2008/0098750 A1 | 5/2008 | Busier |
| 2008/0098972 A1 | 5/2008 | Elwart |
| 2008/0179047 A1 | 7/2008 | Yesin et al. |
| 2008/0202155 A1 | 8/2008 | Taras et al. |
| 2008/0209919 A1 | 9/2008 | Ackermann et al. |
| 2008/0236175 A1 | 10/2008 | Chaparro Monferrer et al. |
| 2009/0000310 A1 | 1/2009 | Bell et al. |
| 2009/0056916 A1 | 3/2009 | Yesin et al. |
| 2009/0126905 A1 | 5/2009 | Dinh |
| 2009/0139263 A1 | 6/2009 | Brostow et al. |
| 2009/0229794 A1 | 9/2009 | Schon |
| 2009/0293500 A1 | 12/2009 | Chen et al. |
| 2009/0293504 A1 | 12/2009 | Oomen et al. |
| 2009/0308571 A1 | 12/2009 | Thompson et al. |
| 2009/0314472 A1 | 12/2009 | Kim et al. |
| 2010/0000233 A1 | 1/2010 | Groothuis et al. |
| 2010/0006265 A1 | 1/2010 | De Larminat et al. |
| 2010/0031991 A1 | 2/2010 | Mochizukil et al. |
| 2010/0043463 A1 | 2/2010 | Fleming et al. |
| 2010/0059880 A1 | 3/2010 | Baek |
| 2010/0078061 A1 | 4/2010 | Lu et al. |
| 2010/0146991 A1 | 6/2010 | Ilercil et al. |
| 2010/0154109 A1 | 6/2010 | Roseberry |
| 2010/0155034 A1 | 6/2010 | Müller et al. |
| 2010/0186820 A1 | 7/2010 | Schon |
| 2010/0248968 A1 | 9/2010 | Stautner |
| 2010/0288586 A1 | 11/2010 | Gorbounov et al. |
| 2010/0300654 A1 | 12/2010 | Edwards |
| 2010/0305918 A1 | 12/2010 | Udell |
| 2010/0326627 A1 | 12/2010 | Schon |
| 2010/0326632 A1 | 12/2010 | Nagai et al. |
| 2011/0030400 A1 | 2/2011 | Agostini et al. |
| 2011/0043092 A1 | 2/2011 | Shuja et al. |
| 2011/0048676 A1 | 3/2011 | Toyoda et al. |
| 2011/0073284 A1 | 3/2011 | Yoo et al. |
| 2011/0120673 A1 | 5/2011 | Xiang et al. |
| 2011/0162829 A1 | 7/2011 | Xiang |
| 2011/0174003 A1 | 7/2011 | Wenger |
| 2011/0203777 A1 | 8/2011 | Zhao et al. |
| 2011/0206965 A1 | 8/2011 | Han et al. |
| 2011/0259041 A1 | 10/2011 | Kuehl et al. |
| 2011/0272319 A1 | 11/2011 | Koivuluoma et al. |
| 2011/0277967 A1 | 11/2011 | Fried et al. |
| 2011/0284189 A1 | 11/2011 | Sinha et al. |
| 2011/0289953 A1 | 12/2011 | Alston |
| 2011/0308709 A1 | 12/2011 | Ouellette |
| 2012/0017625 A1 | 1/2012 | Kroliczek et al. |
| 2012/0019098 A1 | 1/2012 | Erbil et al. |
| 2012/0024497 A1 | 2/2012 | Kroliczek et al. |
| 2012/0047917 A1 | 3/2012 | Rafalovich |
| 2012/0067558 A1 | 3/2012 | Phan et al. |
| 2012/0087090 A1 | 4/2012 | Feng et al. |
| 2012/0090343 A1 | 4/2012 | Couto et al. |
| 2012/0111553 A1 | 5/2012 | Tsoi et al. |
| 2012/0131932 A1 | 5/2012 | Kroliczek et al. |

(56) References Cited

U.S. PATENT DOCUMENTS

| | | | |
|---|---|---|---|
| 2012/0140403 A1 | 6/2012 | Lau et al. | |
| 2012/0175087 A1 | 7/2012 | Kroliczek et al. | |
| 2012/0176794 A1 | 7/2012 | Joung et al. | |
| 2013/0291555 A1* | 11/2013 | Edwards | F25B 21/02 62/3.2 |
| 2013/0291557 A1* | 11/2013 | Edwards | F25B 21/02 62/3.2 |
| 2014/0318153 A1* | 10/2014 | Ilercil | F25B 21/04 62/3.3 |

FOREIGN PATENT DOCUMENTS

| | | |
|---|---|---|
| DE | 102007051164 A1 | 5/2008 |
| EP | 0484034 A1 | 5/1992 |
| EP | 0910535 A1 | 4/1999 |
| EP | 0697085 B1 | 9/1999 |
| EP | 1003006 A1 | 5/2000 |
| EP | 1388444 B1 | 2/2006 |
| EP | 1553841 B1 | 5/2006 |
| EP | 1909053 A2 | 4/2008 |
| EP | 1639060 B1 | 5/2008 |
| EP | 1967808 A1 | 9/2008 |
| EP | 2276046 A1 | 1/2011 |
| EP | 2330067 A1 | 6/2011 |
| EP | 2463870 A1 | 6/2012 |
| JP | 54048350 A | 4/1979 |
| JP | 56012997 A | 2/1981 |
| JP | 57196089 A | 12/1982 |
| JP | 57202494 A | 12/1982 |
| JP | 58123091 A | 7/1983 |
| JP | 58174109 A | 10/1983 |
| JP | 58178191 A | 10/1983 |
| JP | 58198648 A | 11/1983 |
| JP | 60253791 A | 12/1985 |
| JP | 61142635 A | 6/1986 |
| JP | 61228292 A | 10/1986 |
| JP | 62041531 A | 2/1987 |
| JP | 62284147 A | 12/1987 |
| JP | 62294897 A | 12/1987 |
| JP | 1222825 A | 9/1989 |
| JP | 2238117 A | 9/1990 |
| JP | 9164316 A | 6/1997 |
| JP | 9222286 A | 8/1997 |
| JP | 9273877 A | 10/1997 |
| JP | 11063862 A | 3/1999 |
| JP | 3054098 B2 | 6/2000 |
| JP | 3273669 B2 | 4/2002 |
| JP | 2003244968 A | 8/2003 |
| JP | 2003343985 A | 12/2003 |
| JP | 2004140429 A | 5/2004 |
| JP | 2004278968 A | 10/2004 |
| JP | 2005315462 A | 11/2005 |
| JP | 2007093112 A | 4/2007 |
| JP | 4039380 B2 | 1/2008 |
| JP | 2008311399 A | 12/2008 |
| JP | 2009115396 A | 5/2009 |
| KP | 2004067701 A | 7/2004 |
| KR | 2005017631 A | 2/2005 |
| KR | 2005017738 A | 2/2005 |
| KR | 539044 B1 | 12/2005 |
| KR | 757614 B1 | 9/2007 |
| KR | 820448 B1 | 4/2008 |
| KR | 870985 B1 | 12/2008 |

OTHER PUBLICATIONS

U.S. Appl. No. 13/888,791, filed May 7, 2013.
U.S. Appl. No. 13/867,519, filed Apr. 22, 2013.
U.S. Appl. No. 13/867,567, filed Apr. 22, 2013.
U.S. Appl. No. 13/867,589, filed Apr. 22, 2013.
U.S. Appl. No. 13/888,799, filed May 7, 2013.
U.S. Appl. No. 13/888,820, filed May 7, 2013.
U.S. Appl. No. 13/888,833, filed May 7, 2013.
U.S. Appl. No. 13/888,847, filed May 7, 2013.
U.S. Appl. No. 14/849,232, filed Sep. 9, 2015.
Notice of Allowance and Examiner-Initiated Interview Summary for U.S. Appl. No. 13/888,799, mailed Jan. 5, 2016, 9 pages.
Levine, Milton, "Putting Solid-State Coolers to Work," Machine Design, Tech Briefs: Solid State Coolers, vol. 64, Issue 21, Oct. 22, 1992, 2 pages.
Examiner's Answer for U.S. Appl. No. 13/888,791, mailed Feb. 11, 2016, 10 pages.
International Preliminary Report on Patentability for PCT/US2013/039943, mailed Apr. 28, 2014, 9 pages.
Non-Final Office Action for U.S. Appl. No. 13/888,791, mailed Nov. 22, 2013, 17 pages.
Final Office Action for U.S. Appl. No. 13/888,791, mailed Jun. 4, 2014, 20 pages.
Advisory Action and Examiner-Initiated Interview Summary for U.S. Appl. No. 13/888,791, mailed Sep. 3, 2014, 5 pages.
Advisory Action and Examiner-Initiated Interview Summary for U.S. Appl. No. 13/888,791, mailed Oct. 2014, 5 pages.
Non-Final Office Action for U.S. Appl. No. 13/888,791, mailed Oct. 24, 2014, 21 pages.
Final Office Action for U.S. Appl. No. 13/888,791, mailed Apr. 1, 2015, 21 pages.
Non-Final Office Action for U.S. Appl. No. 13/836,525, mailed Nov. 25, 2013, 21 pages.
International Search Report and Written Opinion for PCT/US2013/039945, mailed Dec. 9, 2013, 9 pages.
International Preliminary Report on Patentability for PCT/US2013/039945, mailed Jul. 28, 2014, 8 pages.
International Search Report and Written Opinion for International Patent Application No. PCT/US2015/041383, mailed Nov. 10, 2015, 11 pages.
International Search Report and Written Opinion for International Patent Application No. PCT/US2015/041388, mailed Oct. 28, 2015, 9 pages.
Notice of Intention to Grant a European Patent for European Patent Application No. 13724982.7, mailed Jun. 8, 2016, 7 pages.
Written Opinion for International Patent Application No. PCT/US2015/041383, mailed Jul. 21, 2016, 5 pages.
Written Opinion for International Patent Application No. PCT/US2015/041388, mailed Jul. 26, 2016, 5 pages.
Non-Final Office Action for U.S. Appl. No. 14/849,232, mailed Mar. 21, 2016, 11 pages.
First Office Action for Chinese Patent Application No. 201380036256.1, issued Mar. 28, 2016, 13 pages.
Final Office Action for U.S. Appl. No. 14/849,232, mailed Aug. 15, 2016, 10 pages.
Limei, Shen et al., "Analysis of the crucial factors affecting the performance of thermoelectric cooling," Infrared and Laser Engineering, vol. 40, Issue 10, Oct. 2011, China Aerospace Science and Industry Corporation, 7 pages (Abstract).
Second Office Action and Search Report for Chinese Patent Application No. 201380036256.1, mailed Nov. 2, 2016, 15 pages.
First Office Action and Search Report for Chinese Patent Application No. 201380029824.5, issued Oct. 9, 2016, 29 pages.
International Preliminary Report on Patentability for International Patent Application No. PCT/US2015/041383, mailed Oct. 27, 2016, 6 pages.
International Preliminary Report on Patentability for International Patent Application No. PCT/US2015/041388, mailed Dec. 6, 2016, 6 pages.

* cited by examiner

SYSTEMS AND METHODS FOR OPERATING A THERMOELECTRIC MODULE TO INCREASE EFFICIENCY

RELATED APPLICATIONS

This application is a continuation of International patent application serial number PCT/US15/41388, filed Jul. 21, 2015, which claims the benefit of provisional patent application Ser. No. 62/027,080, filed Jul. 21, 2014, the disclosure of which is hereby incorporated herein by reference in its entirety and of provisional patent application Ser. No. 62/027,083, filed Jul. 21, 2014, the disclosure of which is hereby incorporated herein by reference in its entirety.

FIELD OF THE DISCLOSURE

The present disclosure relates to operation of a thermoelectric module.

BACKGROUND

Today, many refrigeration systems are vapor compression based and utilize a thermostatically regulated duty cycle control. However, typical vapor compression based refrigeration systems are not dynamic enough to meet both the steady state and transient demand, such as during pull down or recovery. Thus, vapor compression based refrigeration systems tend to have excess cooling capabilities that far exceed heat extraction demands required during steady state operation. While the extra capacity provided by the excess cooling capabilities allows improved pull down performance, large current surges prevalent during start-up requires higher capacity and consequently more expensive components to handle the loads. Moreover, the large current surges and loads incurred by duty cycle control excessively wear the components, thereby potentially causing premature failure. Further, by the very nature of their control, thermodynamic limits, and product performance demands, vapor compression based refrigeration systems are less efficient than optimum.

The sub-optimum efficiency disadvantage of vapor compression based refrigeration systems relates to precisely controlling the temperature within a cooling chamber. Typically, when a temperature within a cooling chamber exceeds a certain value, the vapor compression based refrigeration system activates and continues to run until the temperature in the cooling chamber is below the certain value. Once the cooling chamber reaches a temperature below the certain value, the vapor compression based refrigeration system shuts off. Nonetheless, in addition to excessive wear as noted above, this type of control scheme will typically have a relatively large control band and a relatively large internal temperature stratification in an effort to minimize energy consumption and allow for operation in varied ambient conditions. This regime is most often utilized because throttling or capacity variation is difficult and expensive to implement into the vapor compression cycle and provides limited efficacy as volumetric efficiency falls.

Accordingly, systems and methods are needed for precisely controlling the temperature within a cooling chamber where the efficiency of the components used to extract heat from the cooling chamber is maximized. Also, systems and methods are needed for mitigating heat rejection limitations of the components used to extract heat from the cooling chamber.

SUMMARY

Systems and methods for operating a thermoelectric module to increase efficiency are disclosed. In some embodiments, a method of operating a thermoelectric module includes determining a first amount of power that would maximize a coefficient of performance of the thermoelectric module based on one or more system parameters and providing the first amount of power to the thermoelectric module. The method also includes determining that at least one of the one or more system parameters has changed, determining a second amount of power that would maximize the coefficient of performance of the thermoelectric module based on the one or more system parameters, and providing the second amount of power to the thermoelectric module. In some embodiments, adjusting the amount of power provided based on the one or more system parameters increases the efficiency of the thermoelectric module.

In some embodiments, providing the first amount of power to the thermoelectric module includes providing a first amount of current to the thermoelectric module, and providing the second amount of power to the thermoelectric module includes providing a second amount of current to the thermoelectric module. In some embodiments, providing the first amount of power to the thermoelectric module includes providing a first amount of voltage to the thermoelectric module, and providing the second amount of power to the thermoelectric module includes providing a second amount of voltage to the thermoelectric module.

In some embodiments, the thermoelectric module is operative to reduce a temperature of a cooling chamber, and the first amount of power and/or the second amount of power is determined based on the temperature of the cooling chamber, a temperature of a hot side of the thermoelectric module, a temperature of an environment that is external to the cooling chamber, and/or an electric property of the thermoelectric module such as the figure of merit.

In some embodiments, determining the first amount of power includes determining the first amount of power that would maximize the coefficient of performance of the thermoelectric module based on the temperature of the environment that is external to the cooling chamber; determining that at least one of the one or more system parameters has changed includes determining that the temperature of the environment that is external to the cooling chamber has changed; and determining the second amount of power includes determining the second amount of power that would maximize the coefficient of performance of the thermoelectric module based on the temperature of the environment that is external to the cooling chamber.

In some embodiments, determining the first amount of power includes determining the first amount of power that would maximize the coefficient of performance of the thermoelectric module based on the one or more system parameters using a lookup table; and determining the second amount of power includes determining the second amount of power that would maximize the coefficient of performance of the thermoelectric module based on the one or more system parameters using the lookup table.

In some embodiments, providing the first amount of power to the thermoelectric module also includes providing the first amount of power to one subset of more than one subset of thermoelectric modules, and providing the second amount of power to the thermoelectric module also includes providing the second amount of power to the one subset of the more than one subset of thermoelectric modules.

In some embodiments, the method also includes determining that a temperature of a hot side of the thermoelectric module is above a first threshold, and providing an amount of power to the thermoelectric module that is less than the amount of power that would maximize the coefficient of performance of the thermoelectric module based on the one or more system parameters.

In some embodiments, the method also includes determining that the temperature of the hot side of the thermoelectric module is below a second threshold, and providing an amount of power to the thermoelectric module that is the amount of power that would maximize the coefficient of performance of the thermoelectric module based on the one or more system parameters.

In some embodiments, a thermoelectric refrigeration system includes a cooling chamber, a heat exchanger, and a controller. The heat exchanger includes a cold side heat sink, a hot side heat sink, and a thermoelectric module disposed between the cold side heat sink and the hot side heat sink. The controller is configured to determine a first amount of power that would maximize a coefficient of performance of the thermoelectric module based on one or more system parameters and provide the first amount of power to the thermoelectric module. The controller is also configured to determine that at least one of the one or more system parameters has changed; determine a second amount of power that would maximize the coefficient of performance of the thermoelectric module based on the one or more system parameters; and provide the second amount of power to the thermoelectric module.

In some embodiments, a controller for operating a thermoelectric module is adapted to determine a first amount of power that would maximize a coefficient of performance of the thermoelectric module based on one or more system parameters; provide the first amount of power to the thermoelectric module; determine that at least one of the one or more system parameters has changed; determine a second amount of power that would maximize the coefficient of performance of the thermoelectric module based on the one or more system parameters; and provide the second amount of power to the thermoelectric module. In some embodiments, the controller is adapted to perform any method disclosed herein.

In some embodiments, a computer program includes instructions which, when executed on at least one processor, cause the at least one processor to carry out any method disclosed herein. In some embodiments, a carrier contains the computer program where the carrier is one of an electronic signal, an optical signal, a radio signal, or a computer readable storage medium.

In some embodiments, a controller for operating a thermoelectric module includes a power determining module, a power providing module, and a system parameter determining module. The power determining module is operative to determine a first amount of power that would maximize a coefficient of performance of the thermoelectric module based on one or more system parameters and determine a second amount of power that would maximize the coefficient of performance of the thermoelectric module based on the one or more system parameters. The power providing module is operative to provide the first amount of power to the thermoelectric module and to provide the second amount of power to the thermoelectric module. The system parameter determining module is operative to determine that at least one of the one or more system parameters has changed.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
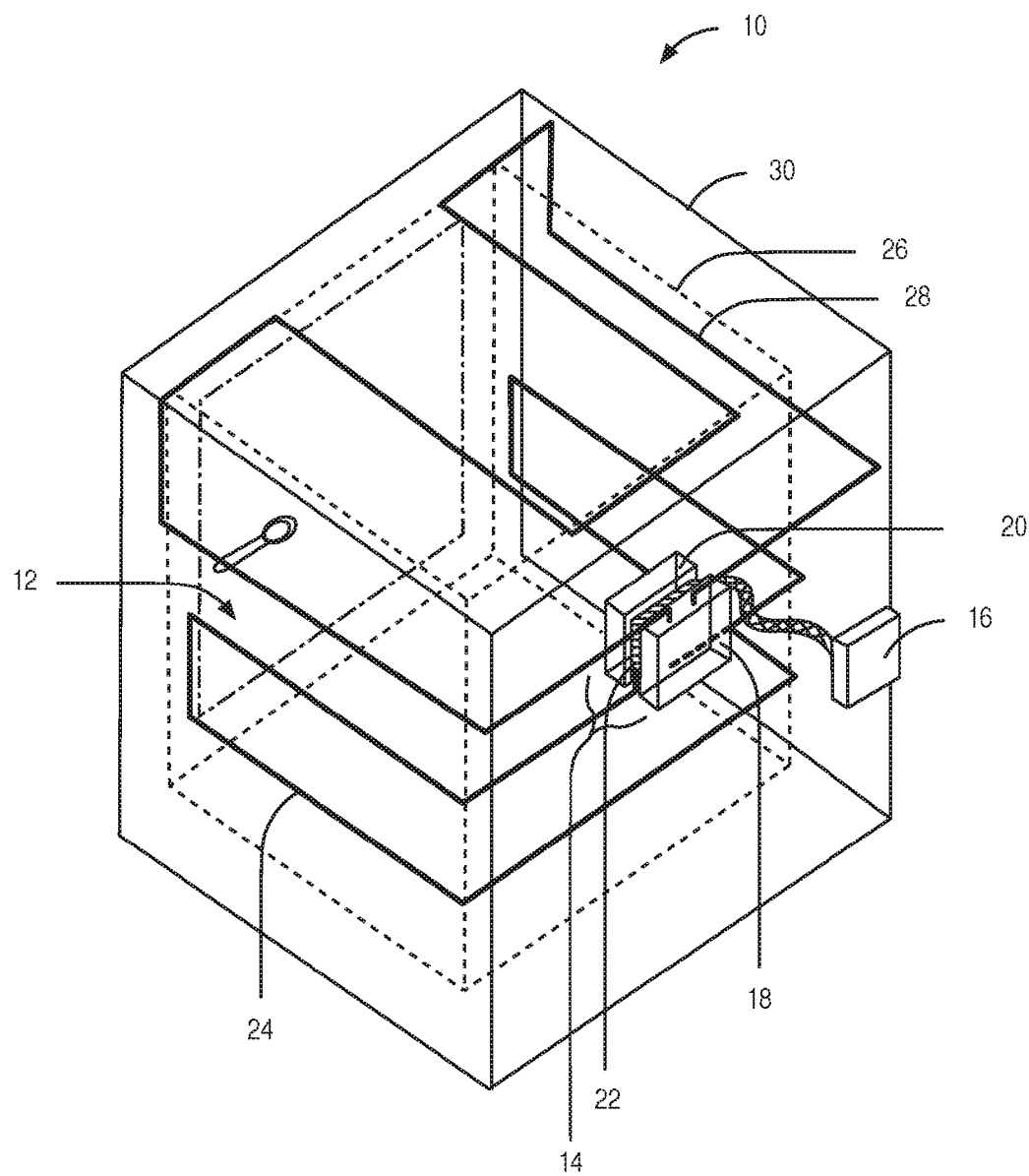
FIG. 1 illustrates a thermoelectric refrigeration system having a cooling chamber, a heat exchanger including at least one Thermoelectric Module (TEM) disposed between a cold side heat sink and a hot side heat sink, and a controller that controls the TEM according to some embodiments of the present disclosure.

FIG. 1 illustrates a thermoelectric refrigeration system 10 having a cooling chamber 12, a heat exchanger 14 including at least one Thermoelectric Module (TEM) 22 (referred to herein singularly as TEM 22 or plural as TEMs 22) disposed between a cold side heat sink 20 and a hot side heat sink 18, and a controller 16 that controls the TEM 22 according to some embodiments of the present disclosure. When a TEM 22 is used to provide cooling it may sometimes be referred to as a Thermoelectric Cooler (TEC) 22.

The TEMs 22 are preferably thin film devices. When one or more of the TEMs 22 are activated by the controller 16, the activated TEMs 22 operate to heat the hot side heat sink 18 and cool the cold side heat sink 20 to thereby facilitate heat transfer to extract heat from the cooling chamber 12. More specifically, when one or more of the TEMs 22 are activated, the hot side heat sink 18 is heated to thereby create an evaporator and the cold side heat sink 20 is cooled to thereby create a condenser, according to some embodiments of the current disclosure.

Acting as a condenser, the cold side heat sink 20 facilitates heat extraction from the cooling chamber 12 via an accept loop 24 coupled with the cold side heat sink 20. The accept loop 24 is thermally coupled to an interior wall 26 of the thermoelectric refrigeration system 10. The interior wall 26 defines the cooling chamber 12. In one embodiment, the accept loop 24 is either integrated into the interior wall 26 or integrated directly onto the surface of the interior wall 26. The accept loop 24 is formed by any type of plumbing that allows for a cooling medium (e.g., a two-phase coolant) to flow or pass through the accept loop 24. Due to the thermal coupling of the accept loop 24 and the interior wall 26, the cooling medium extracts heat from the cooling chamber 12 as the cooling medium flows through the accept loop 24. The accept loop 24 may be formed of, for example, copper tubing, plastic tubing, stainless steel tubing, aluminum tubing, or the like.

Acting as an evaporator, the hot side heat sink 18 facilitates rejection of heat to an environment external to the cooling chamber 12 via a reject loop 28 coupled to the hot side heat sink 18. The reject loop 28 is thermally coupled to an outer wall 30, or outer skin, of the thermoelectric refrigeration system 10.

The thermal and mechanic processes for removing heat from the cooling chamber 12 are not discussed further. Also, it should be noted that the thermoelectric refrigeration system 10 shown in FIG. 1 is only a particular embodiment of a use and control of a TEM 22. All embodiments discussed herein should be understood to apply to thermoelectric refrigeration system 10 as well as any other use of a TEM 22.

Continuing with the example embodiment illustrated in FIG. 1, the controller 16 operates to control the TEMs 22 in order to maintain a desired set point temperature within the cooling chamber 12. In general, the controller 16 operates to selectively activate/deactivate the TEMs 22, selectively control an amount of power provided to the TEMs 22, and/or selectively control a duty cycle of the TEMs 22 to maintain the desired set point temperature. Further, in preferred embodiments, the controller 16 is enabled to separately, or independently, control one or more and, in some embodiments, two or more subsets of the TEMs 22, where each subset includes one or more different TEMs 22. Thus, as an example, if there are four TEMs 22, the controller 16 may be enabled to separately control a first individual TEM 22, a second individual TEM 22, and a group of two TEMs 22. By this method, the controller 16 can, for example, selectively activate one, two, three, or four TEMs 22 independently, at maximized efficiency, as demand dictates.

It should be noted that the thermoelectric refrigeration system 10 is only an example implementation and that the systems and methods disclosed herein are applicable to other systems as well. Also, while specific reference is made herein to the controller 16, it should be understood that any of the functions ascribed to the controller 16 could be implemented by any other controller or mechanism.

Figure 2:
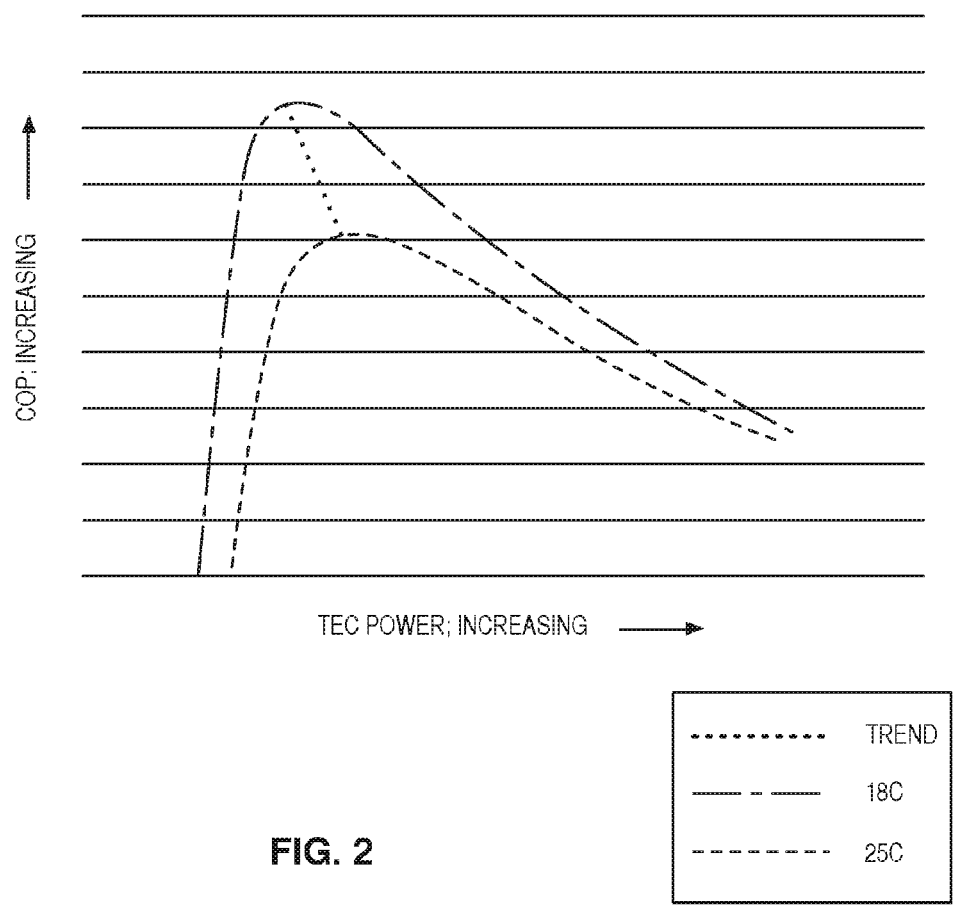
FIG. 2 illustrates a relationship between a Coefficient of Performance of a TEM and an amount of power provided to the TEM for various ambient temperatures according to some embodiments of the present disclosure.

Before proceeding, a brief discussion of a cooling capacity versus an amount of power provided to a TEM 22 and efficiency versus an amount of power provided to a TEM 22 is beneficial. In this regard, FIG. 2 is a graph that illustrates cooling capacity (Q) and cooling efficiency of a TEC versus an input current of a TEC. The cooling efficiency is more specifically represented by a Coefficient of Performance (COP). FIG. 2 illustrates a relationship between a Coefficient of Performance (COP) of a TEM 22 and an amount of power provided to the TEM 22 for various ambient temperatures according to some embodiments of the present disclosure. The amount of power provided to the TEM 22 may be expressed as an amount of current provided to the TEM 22 and/or an amount of voltage provided to the TEM 22. As the amount of power provided to the TEM 22 increases, the cooling capacity of the TEM 22 also increases. The amount of power that is at or near a maximum amount of power for the TEM 22 is denoted as $Q_{max}$. Thus, when the TEM 22 is operating at $Q_{max}$, the TEM 22 is removing the greatest amount of heat possible. FIG. 2 illustrates the COP of the TEM 22 as a function of the amount of power provided to the TEM 22. For cooling applications, the COP of a TEM 22 is the ratio of heat removed over an amount of work input to the TEM 22 to remove the heat. The amount of heat, or capacity, (Q) at which the COP of the TEM 22 is maximized is denoted as $Q_{COPmax}$. Thus, the efficiency, or COP, of the TEM 22 is maximized when the amount of power provided to the TEM 22 is at or near the point where the COP of the TEM 22 is maximized.

The shape of the COP curve for a TEM 22 is dependent upon variables such as operating ambient temperature (also referred to as the temperature of an environment that is external to the cooling chamber 12 or the temperature of the environment in which the TEM 22 is operating), an amount of heat being rejected, the temperature of the cold side of the TEM 22 (also sometimes referred to as the temperature of the cooling chamber 12 when the TEM 22 is operable to cool a cooling chamber 12), the temperature of the hot side of the TEM 22, an electrical property of the TEM 22 (such as the figure of merit), and the amount of power provided to the TEM 22. When one of these system parameters changes, the COP curve of the TEM 22 may change, and therefore the amount of power that would maximize the COP of the TEM 22 based on one or more of the system parameters may also change. FIG. 2 illustrates one example of this. Two COP curves are shown for a TEM 22 at ambient temperatures equal to 18 degrees Celsius (° C.) and 25° C. For simplicity, only the ambient temperature is changed while the other system parameters are fixed. In this example, when the ambient temperature changes from 18° C. to 25° C., the overall COP of the TEM 22 decreases. Notably, the amount of power that maximizes the COP of the TEM 22 also increases. A trend line is shown that gives a linear approximation of the relationship between the ambient temperature and the amount of power that maximizes the COP of the TEM 22. This trend line is only one example and other means of modelling or interpolating (or extrapolating) the relationship could be used.

Since the precise amount of power that maximizes the COP of the TEM 22 is based on many factors that might be changing, a range of acceptable amounts of power centered at the amount of power that maximizes the COP of the TEM 22 is determined. This range is referred to as a band, and any amount of power within that band is generally considered to be the amount of power that maximizes the COP of the TEM 22. In some embodiments the band is the amount of power that maximizes the COP of the TEM 22 plus or minus 10%, but this is implementation specific and may depend on the precision of determining the amount of power that maximizes the COP of the TEM 22 and/or the shape of the COP curve.

Figure 3:
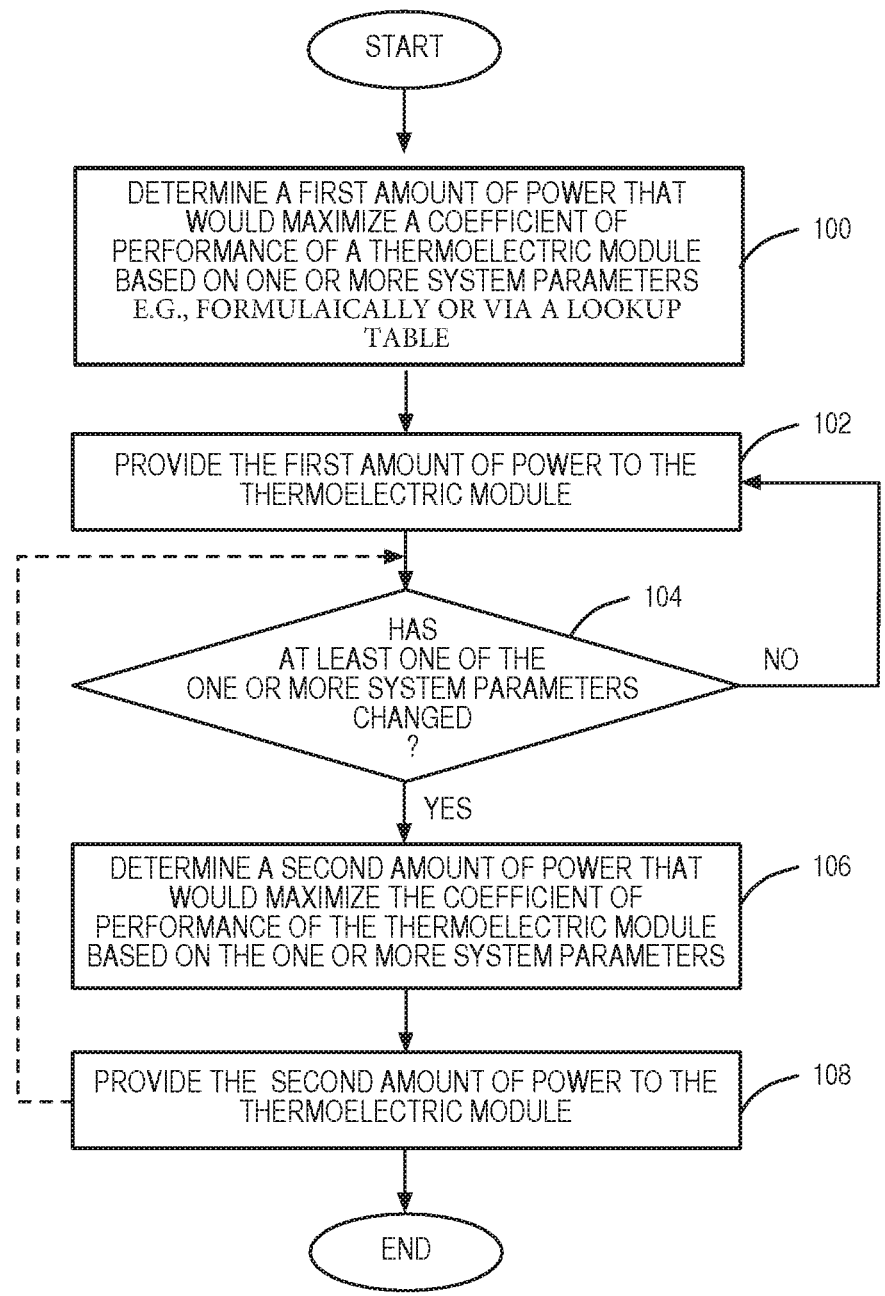
FIG. 3 illustrates a method of operating a TEM to increase efficiency of the TEM according to some embodiments of the present disclosure.

Since the most efficient way to operate the TEM 22 is to provide the amount of power that maximizes the COP of the TEM 22, the controller 16 or some other means of controlling the TEM 22 should seek to determine the amount of power that maximizes the COP of the TEM 22 based on one or more system parameters. As such, FIG. 3 illustrates a method of operating a TEM 22 to increase efficiency of the TEM 22 according to some embodiments of the present disclosure. The controller 16 determines a first amount of power that would maximize the COP of the TEM 22 based on one or more system parameters (step 100). As discussed above, this determination may be based on many different parameters. In some embodiments, the determination is based on only one parameter, such as ambient temperature, assuming other parameters to be constant or negligible. In some embodiments, the amount of power may be determined by consulting a lookup table. The controller 16 then provides the first amount of power to the TEM 22 (step 102). In this way, the TEM 22 is operating in the most efficient way for the current values of the system parameters.

The controller 16 next determines if at least one of the system parameters has changed (step 104). In some embodiments, then check may be performed periodically while in other embodiments the determination of the change may be almost immediate. Also, if the controller 16 is using less than all of the system parameters to determine the amount of power, then the controller 16 will not need to determine when any of the unused system parameters have changed. In response to the determination that at least one of the system parameters has changed, the controller 16 determines a second amount of power that would maximize the COP of the TEM 22 based on the one or more system parameters (step 106). The controller 16 then provides the second amount of power to the TEM 22 (step 108). In this way, the controller 16 can update the amount of power provided to the TEM 22 to increase the efficiency of the operation of the TEM 22. In some embodiments, the procedure optionally returns to step 104 and if one or more of the system parameters have changed, the controller 16 again determines an amount of power that would maximize the COP of the TEM 22.

Note that in some embodiments the updated amount of power may be calculated periodically or otherwise without the express determination that one or more of the system parameters have changed. Also, depending on the changes to the system parameters, the second amount of power may be the same or nearly the same as the first amount of power.

Figure 4:
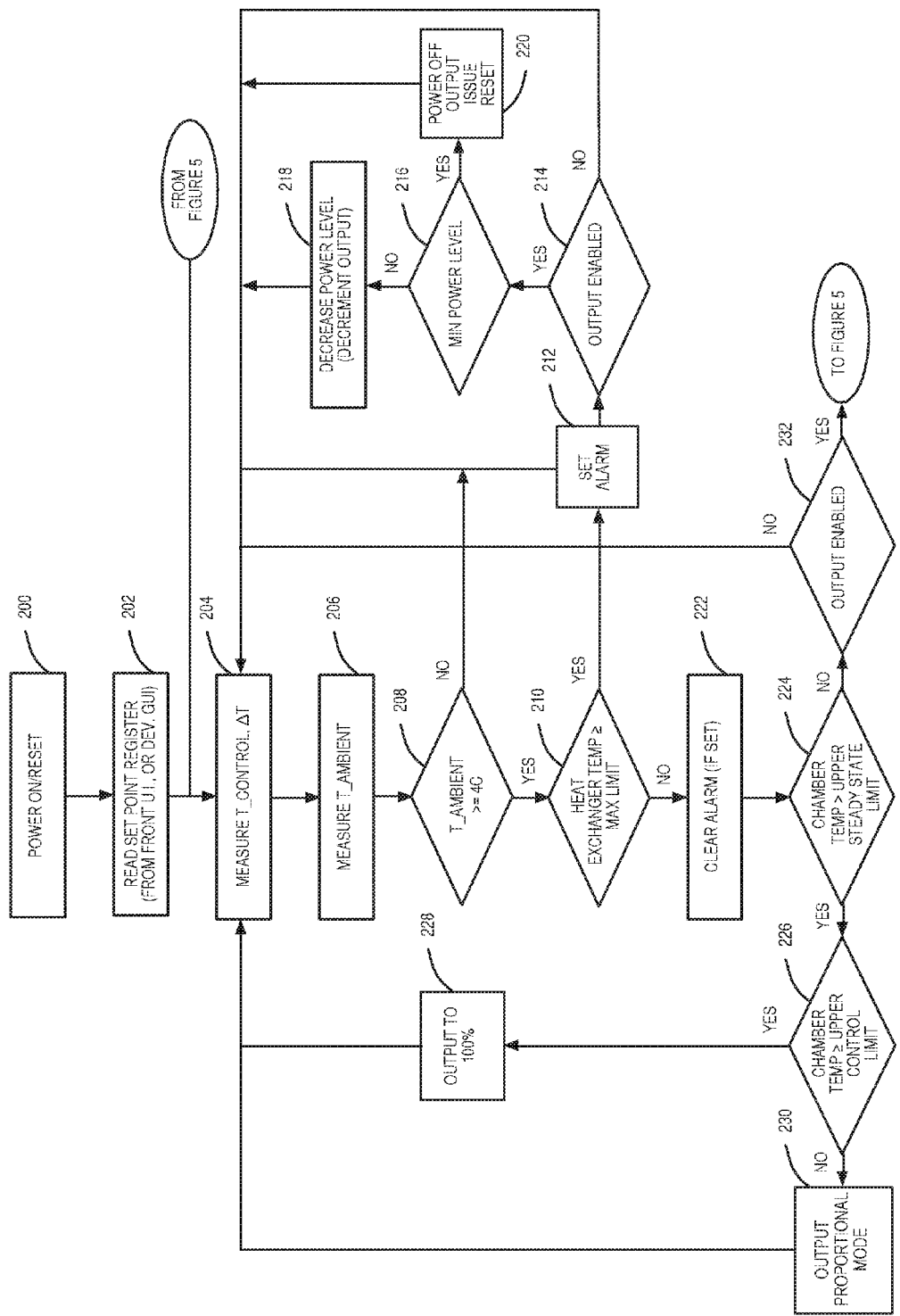
FIG. 4 illustrates a method for operating a thermoelectric refrigeration system when powered on or during pull down operation according to some embodiments of the present disclosure.
Figure 5:
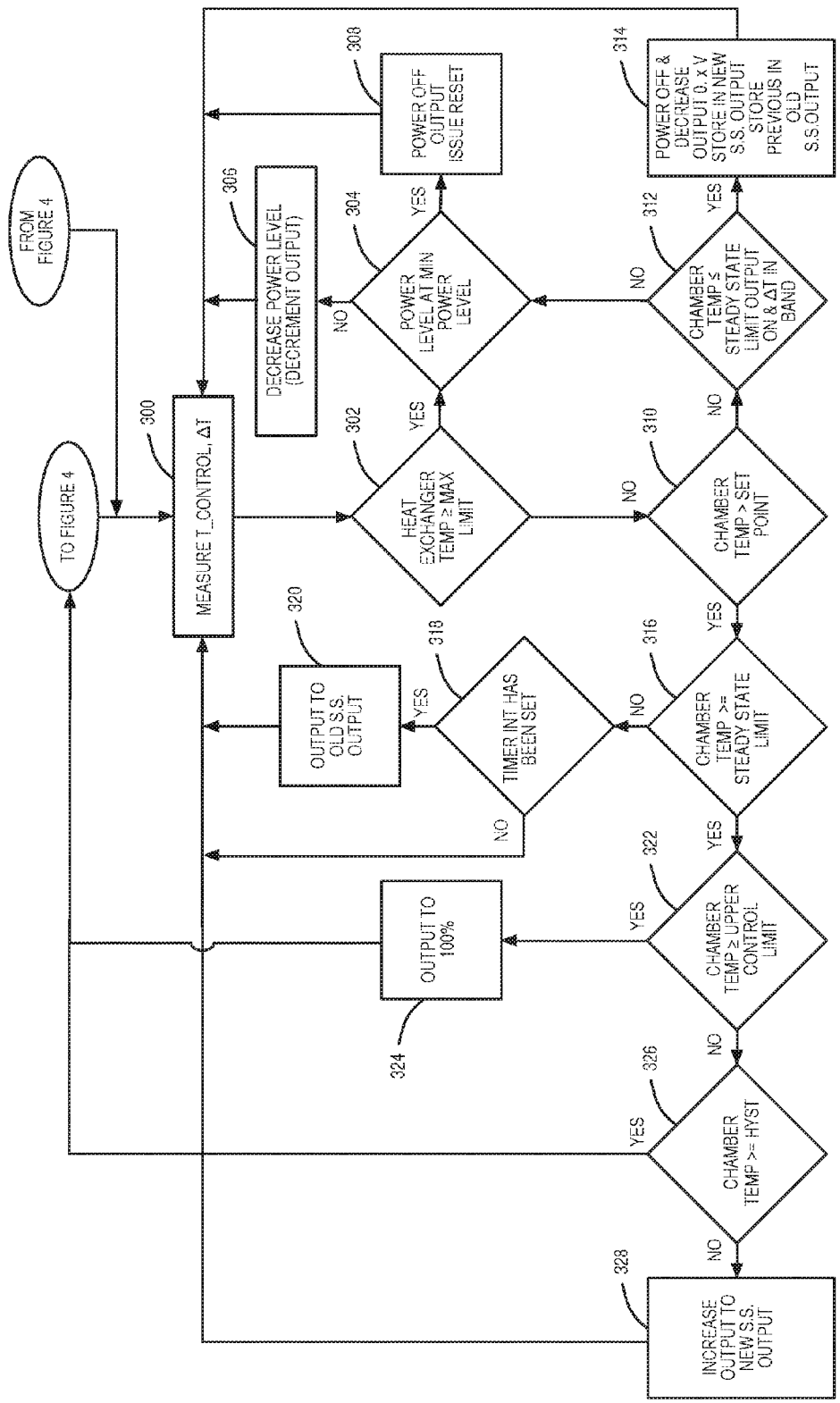
FIG. 5 illustrates a method for operating a thermoelectric refrigeration system near steady state operation according to some embodiments of the present disclosure.

While FIG. 3 illustrates a method of operating a TEM 22 to increase efficiency of the TEM 22, FIGS. 4 and 5 illustrate methods for operating a thermoelectric refrigeration system 10 which may include one or more TEMs 22 as discussed above in relation to the example shown in FIG. 1. Specifically, FIG. 4 illustrates a method for operating a thermoelectric refrigeration system 10 when powered on or during pull down operation according to some embodiments of the present disclosure.

As used herein, pull down operation refers to the situation where the temperature in a cooling chamber 12 is higher than is acceptable and the controller 16 operates to reduce the temperature to an acceptable range. The desired temperature for the cooling chamber 12 is referred to as the set point temperature. Steady state operation refers to the situation where the temperature of the cooling chamber 12 is within a range that includes the set point temperature. This range provides a form of hysteresis to avoid the rapid oscillation between operating states. In some embodiments, the set point temperature may be 4° C., and the steady state range may be from 3° C. to 5° C. If maintaining the set point temperature with greater precision is desired, then the steady state range may be smaller. If a decrease in the rate of oscillation between operating states is desired, then the steady state range may be smaller.

According to some embodiments, FIG. 4 begins with a power on or reset of the thermoelectric refrigeration system 10 (step 200). The thermoelectric refrigeration system 10 starts in this powered on or reset state during pull down operation because the temperature may be above the steady state range and due to be powered off. The controller 16 reads the set point register perhaps from a user interface on the front of the thermoelectric refrigeration system 10 or from a device Graphical User Interface (GUI) to determine the set point temperature (step 202). The controller 16 then measures the temperature control and the ΔT of the at least one TEM 22 (step 204). ΔT of a TEM 22 refers to the difference between the temperature of the hot side of the TEM 22 and the temperature of the cold side of the TEM 22. The controller 16 also measures the ambient temperature (step 206). The controller 16 may also determine any other system parameters that are necessary, depending on the implementation.

The controller 16 then performs a few safety checks according to some embodiments. The controller 16 checks if the ambient temperature is greater than or equal to 4° C. (step 208). If the ambient temperature is less than 4° C., the procedure returns to step 204 to again measure the various system parameters. If the ambient temperature is at least 4° C., then the controller 16 then determines if the temperature of the heat exchanger is greater than or equal to a maximum limit (step 210).

In some embodiments, this temperature is the same as the temperature of the hot side of the TEM 22. Also, in some embodiments, instead of having a single maximum value, there is instead a test of whether the temperature is above a first threshold, and then when the hot side of the TEM 22 cools down there is a test of whether the temperature is below a second threshold. In this way, hysteresis can be optionally built into the overheating condition.

In some embodiments, the first threshold indicates that the hot side of the TEM 22 is saturated and cannot accept any additional heat. Also, the first threshold might indicate that the TEM 22 may be damaged by being operated at temperatures above the first threshold. Such high temperatures might occur when a large amount of heat is removed from the cooling chamber 12 or if the TEM 22 is being operated less efficiently. An accumulation of heat on the hot side of the TEM 22 may also occur when the reject side of the heat exchanger is insufficient to remove the heat at a faster rate than the heat is generated. This situation might occur when the hot side of the TEM 22 is passively cooled.

When the overheating condition is detected, the controller 16 sets an alarm (step 212). This alarm can take many forms depending on the embodiment. In some cases, the alarm is merely an internal state; while in other cases, the information may be presented on a display, or a user may be otherwise notified of the alarm. The controller 16 then determines if output to the TEM 22 is enabled (step 214). If output is not enabled, the controller 16 may not have any way of reducing the temperature of the hot side of the TEM 22 since no heat is being added by the operation of the TEM 22. In this case, the procedure returns to step 204 to again measure the various system parameters. In other embodiments, the controller 16 may have additional options for reducing the temperature of the hot side of the TEM 22 such as by using an active device such as a fan.

If output is enabled, the controller 16 determines if the amount of power being provided to the TEM 22 is the minimum power level (step 216). If it is not the minimum power level, the controller 16 decreases the amount of power provided to the TEM 22 by decrementing the output (step 218). If the current amount of power provided is the minimum power level, then the controller 16 powers off the output and issues a reset (step 220). Either way, the procedure returns to step 204 to again measure the various system parameters.

If the hot side of the TEM 22 is not overheated, the controller 16 clears any alarms that may be set (step 222). For instance, if an alarm had previously been set because of an overheating situation that has now been resolved, then that alarm will be cleared now. The controller 16 now determines if the temperature of the cooling chamber 12 is greater than an upper steady state limit (step 224). If the temperature is above the upper steady state limit, the thermoelectric refrigeration system 10 is considered to be in a pull down mode of operation.

If the temperature of the cooling chamber 12 is determined to be greater than or equal to an upper control limit (step 226), the controller 16 will set the output to 100%, providing the amount of power to the TEM 22 that is at or near a maximum amount of power for the TEM 22 (step 228). In such a way, the thermoelectric refrigeration system 10 can pull down the temperature of the cooling chamber 12 at the fastest rate, according to some embodiments. If the temperature of the cooling chamber 12 is determined to be less than the upper control limit, the controller 16 with set the output to proportional mode (step 230). In proportional mode, the temperature of the cooling chamber 12 may be decreased in a slower, more efficient manner. Either way, the procedure returns to step 204 to again measure the various system parameters.

If the controller 16 determines that the temperature of the cooling chamber 12 is less than an upper steady state limit, then the controller 16 determines if output is enabled (step 232). If output is not enabled, the procedure returns to step 204 to again measure the various system parameters. If output is enabled, the thermoelectric refrigeration system 10 is considered to be operating in steady state mode and the procedure continues on FIG. 5 which illustrates a method for operating a thermoelectric refrigeration system 10 near steady state operation according to some embodiments of the present disclosure.

As shown in FIG. 5, the controller 16 measures the temperature control and the ΔT of the at least one TEM 22 (step 300). The controller 16 also determines any other system parameters that are necessary, such as the ambient temperature, depending on the implementation. Again, the controller 16 determines if the temperature of the heat exchanger is greater than or equal to a maximum limit (step 302). If the amount of power being provided to the TEM 22 is not the minimum power level (step 304), the controller 16 decreases the amount of power provided to the TEM 22 by decrementing the output (step 306). If the current amount of power provided is the minimum power level, then the controller 16 powers off the output and issues a reset (step 308). Either way, the procedure returns to step 300 to again measure the various system parameters.

If the hot side of the TEM 22 is not overheated, the controller 16 checks whether the temperature of the cooling chamber 12 is greater than the set point temperature (step 310). If the temperature of the cooling chamber 12 is less than the set point temperature, the controller 16 now determines if the temperature of the cooling chamber 12 is less than or equal to the steady state limit, the output is on, and ΔT is in the current band (step 312). If all of these are true, the controller 16 powers off the TEM 22 and decreases the output to 0.x Volts, stores this value in the new steady state output value, and stores the previous value in the old steady state output value (step 314). If not all of these conditions are true, then the procedure returns to step 304 and attempts to decrease the amount of power provided to the TEM 22.

If the temperature of the cooling chamber 12 is greater than the set point temperature, the controller 16 determines if the temperature of the cooling chamber 12 is also greater than or equal to the steady state limit (step 316). If the temperature of the chamber is less than the steady state limit, the controller determines if the timer int has been set (step 318). If it has been set, the controller 16 sets the output to the old steady state output (step 320). After this, or if it has not been set, the procedure returns to step 300 to again measure the various system parameters.

If the temperature of the cooling chamber 12 is greater than or equal to the steady state limit, the controller 16 determines if the temperature of the chamber is greater than or equal to the upper control limit (step 322). If the chamber is greater than or equal to the upper control limit, the controller 16 will set the output to 100%, providing the amount of power to the TEM 22 that is at or near a maximum amount of power for the TEM 22 (step 324). This indicates that the thermoelectric refrigeration system 10 is considered to be in a pull down mode of operation, and the procedure returns to step 204 of FIG. 4 to again measure the various system parameters.

If the chamber is less than the upper control limit, the controller 16 will determine if the temperature of the cooling chamber 12 is greater than or equal to the hysteresis value (step 326). If it is not, the controller 16 increases the output to a new steady state output value (step 328), and the procedure returns to step 300 to again measure the various system parameters. According to some embodiments, this new steady state output value may be the amount of power that would maximize the COP of the TEM 22 based on one or more system parameters. If the temperature of the cooling chamber 12 is greater than or equal to the hysteresis value, this again indicates that the thermoelectric refrigeration system 10 is considered to be in a pull down mode of operation, and the procedure returns to step 204 of FIG. 4 to again measure the various system parameters.

Figure 6:
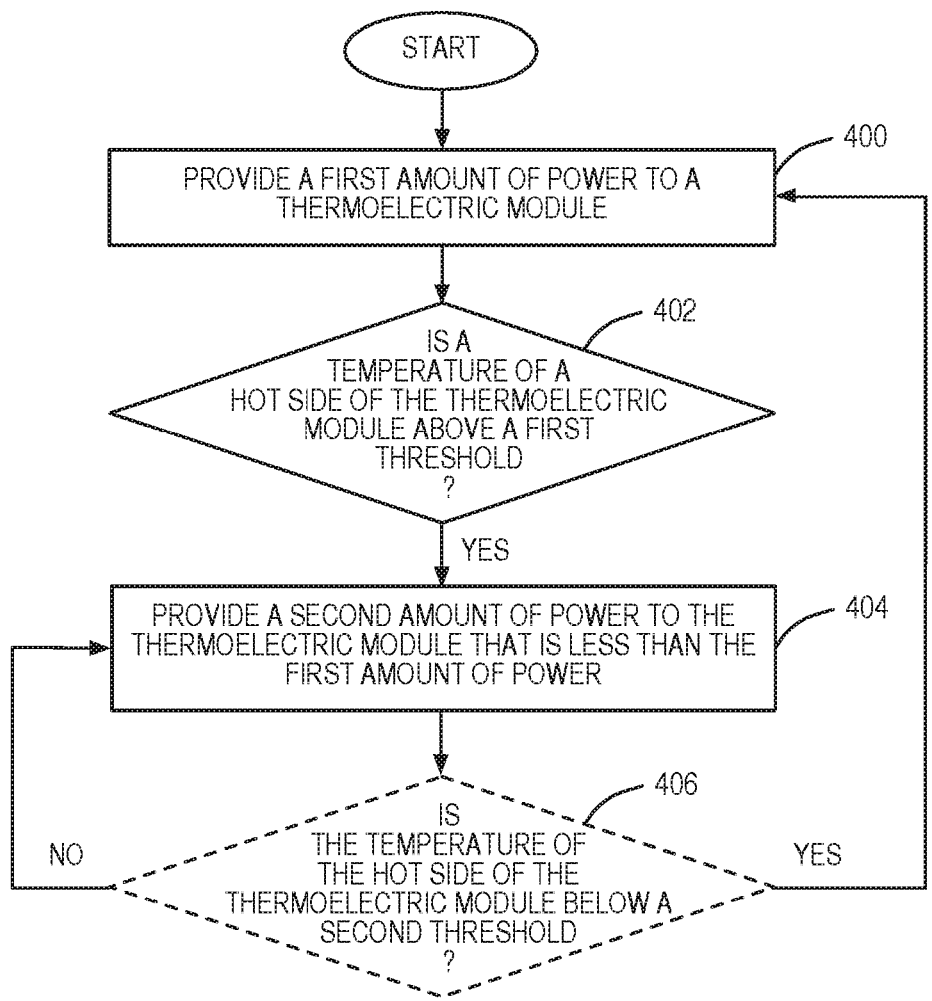
FIG. 6 illustrates a method for operating a TEM to decrease the temperature of the hot side of the TEM according to some embodiments of the present disclosure.

As discussed above, overheating of the TEM 22 or the heat exchanger may cause undesired operation or be dangerous to the TEM 22. As such, both step 210 in FIG. 4 and step 302 in FIG. 5 check for such an overheating condition. While FIGS. 4 and 5 attempt to reduce the temperature of the TEM 22 by reducing the power and powering off the TEM 22, this may be undesirable or inefficient in some situations. As such, FIG. 6 illustrates a method for operating a TEM 22 to decrease the temperature of the hot side of the TEM 22 according to some embodiments of the present disclosure.

The controller 16 first provides a first amount of power to a TEM 22 (step 400). The controller 16 then determines if the temperature of the hot side of the TEM 22 is above a first threshold (step 402). As discussed previously, in some embodiments, the first threshold indicates that the hot side of the TEM 22 is saturated and cannot accept any additional heat. Also, the first threshold might indicate that the TEM 22 may be damaged by being operated at temperatures above the first threshold. If the temperature is not above the first threshold, the controller 16 continues to provide the first amount of power or operate according to any other control scheme that does not include overheating. If the temperature of the hot side of the TEM 22 is above the first threshold, the controller 16 provides a second amount of power to the TEM 22 that is less than the first amount of power (step 404). In some embodiments, this reduced power allows the temperature of the hot side of the TEM 22 to decrease while still operating the TEM 22.

In some embodiments, the controller 16 then determines if the temperature of the hot side of the TEM 22 is below a second threshold (step 406). This indicates that the TEM 22 has cooled down sufficiently and is no longer saturated. In some embodiments, the controller 16 will then provide a third amount of power to the TEM 22 which may be equal to the first amount of power but is not necessarily equal. FIG. 6 illustrates an embodiment where the procedure returns to step 400 and provides the first amount of power again. By increasing the power provided to the TEM 22, additional heat is able to be transferred.

In some embodiments, the first amount of power provided to the TEM 22 is at or near a maximum amount of power for the TEM 22. This is likely the case in a pull down mode of operation when the thermoelectric refrigeration system 10 is trying to remove heat as quickly as possible in order to reach the set point temperature. In some embodiments, the first amount of power provided to the TEM 22 is at or near the point where the COP of the TEM 22 is maximized. This is likely the case in a steady state mode of operation when the thermoelectric refrigeration system 10 is trying to remove the heat most efficiently.

In some embodiments, the second amount of power provided to the TEM 22 is at or near the point where the COP of the TEM 22 is maximized. In some embodiments, the second amount of power provided to the TEM 22 is at least an amount of power such that a temperature of the cooling chamber 12 does not increase. As discussed previously, in some embodiments, this mitigates heat rejection limitations of the TEM 22, especially when the hot side of the TEM 22 is passively cooled.

Figure 7:
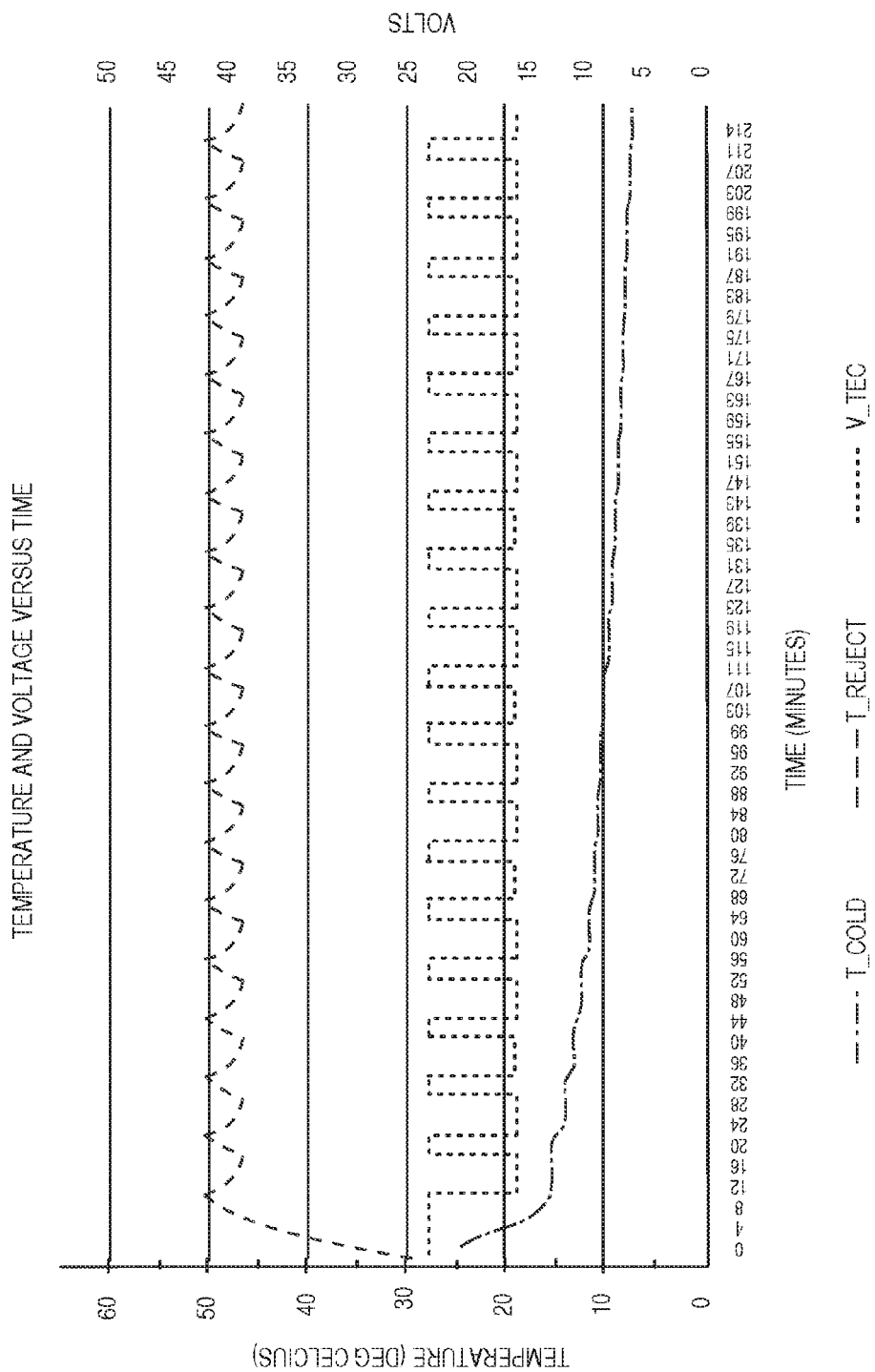
FIG. 7 illustrates one possible implementation of the method of FIG. 6 according to some embodiments of the present disclosure.

FIG. 7 illustrates one possible implementation of the method of FIG. 6 according to some embodiments of the present disclosure. FIG. 7 includes three lines. The top plots the temperature of the reject side (hot side) of the TEM 22. The bottom line plots the temperature of the cold side of the TEM 22. The middle line plots the power provided to the TEM 22 as the voltage applied to the TEM 22. At the beginning of the plot, the temperatures of the hot side and the cold side of the TEM 22 are similar. This may indicate that the thermoelectric refrigeration system 10 has just been powered on or that it is in pull down mode for some other reason such as being left open long enough.

At the beginning, the controller 16 provides a first voltage to the TEM 22. In this example, the temperature of the hot side of the TEM 22 increases while the temperature of the cold side of the TEM 22 decreases. In this example, the first threshold for the temperature of the hot side of the TEM 22 is 50° C. When the controller 16 determines that the temperature of the hot side of the TEM 22 has reached 50° C., the controller 16 reduces the power and provides a second amount of power to the TEM 22 that is less than the first amount. Because of this, less heat is being pumped to the hot side of the TEM 22 and it starts to cool down. Also, the temperature of the cold side of the TEM 22 has slowed its decrease or may be even rising slightly. This amount of power is provided to the TEM 22 until the controller 16 has determined that the hot side of the TEM 22 has cooled down enough.

When the controller 16 determines that the temperature of the hot side of the TEM 22 is below a second threshold, the controller 16 again provides the first amount of power to the TEM 22. This again causes the hot side of the TEM 22 to become overheated, but the cold side of the TEM 22 is now colder than it was when the hot side of the TEM 22 was last saturated. The controller 16 can continue this action of going between the two amounts of power to provide a quick pull down of the temperature of the cooling chamber 12 while mitigating heat rejection limitations of the TEM 22. This can be especially helpful when the hot side of the TEM 22 is passively cooled. While this example only shows two different amounts of power, the methods are not limited thereto. In some embodiments, either the larger amount of power or the smaller amount of power could be at or near the point where the COP of the TEM 22 is maximized, and this value may be recalculated each time based on the system parameters.

In other words, if this is a thermosyphon-based system, the cold side temperature is tied to an insulated chamber (e.g., cooling chamber 12). At the point where heat dissipation on the hot side has saturated and the further decrease of the cold side temperature is stalled, power to the TEM 22 is folded back to a level that will mitigate any elevation of the cold side temperature but allow the hot side temperature to decrease. This exploits the insulation of the cold side and its improved thermal stability over the hot side. Power is held reduced until the hot side temperature has lowered to a point that can allow for more heat rejection. When this point is reached, the TEM 22 power is increased, and the hot side or heat dissipation increases once again towards saturation. However, during this time, the cold side temperature will decrease since the hot side temperature is starting at a lower point. This cycling of power and temperature can be repeated many times to create a very slight pumping effect to augment natural convection around the hot side, allowing more overall heat to dissipate and allowing the cold side to reduce to its set point temperature.

Figure 8:
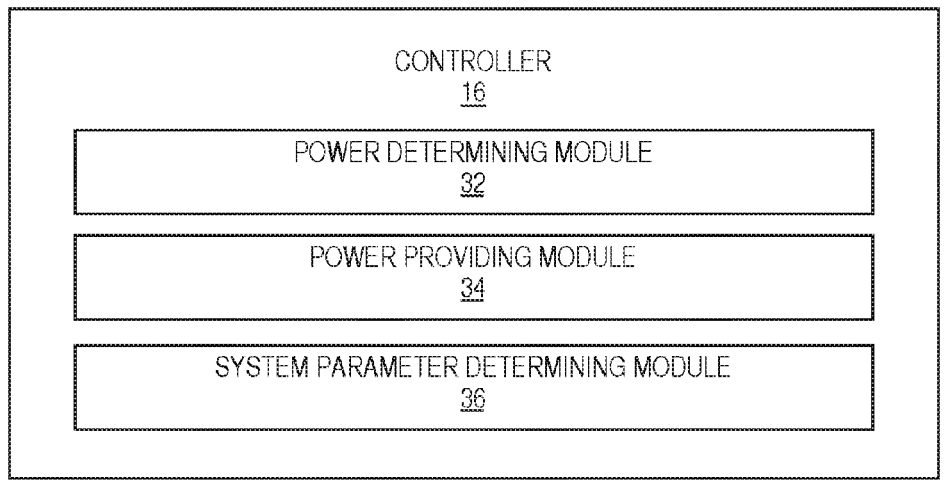
FIG. 8 is a diagram of a controller for operating a TEM including modules according to some embodiments of the present disclosure.

FIG. 8 is a diagram of a controller 16 for operating a TEM 22 including a power determining module 32, a power providing module 34, and a system parameter determining module 36 according to some embodiments of the present disclosure. The power determining module 32, the power providing module 34, and the system parameter determining module 36 are each implemented in software that, when executed by a processor of the controller 16, causes the controller 16 to operate according to one of the embodiments described herein.

Figure 9:
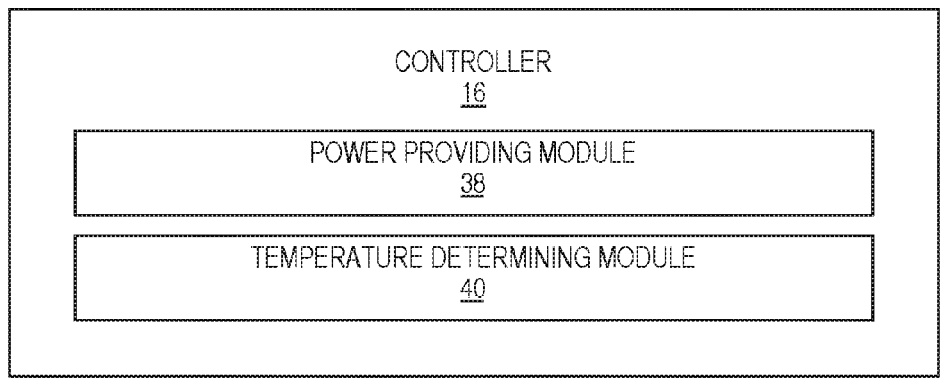
FIG. 9 is another diagram of a controller for operating a TEM including modules according to some embodiments of the present disclosure.

FIG. 9 is another diagram of a controller 16 for operating a TEM 22 including a power providing module 38 and a temperature determining module 40 according to some embodiments of the present disclosure. The power providing module 38 and the temperature determining module 40 are each implemented in software that, when executed by a processor of the controller 16, causes the controller 16 to operate according to one of the embodiments described herein.

Those skilled in the art will recognize improvements and modifications to the preferred embodiments of the present disclosure. All such improvements and modifications are considered within the scope of the concepts disclosed herein and the claims that follow.

What is claimed is:

1. A method of operating a thermoelectric module, comprising:
    determining, by a controller, a first amount of power that would maximize a coefficient of performance of the thermoelectric module based on one or more system parameters;
    providing, by the controller, the first amount of power to the thermoelectric module;
    determining, by the controller, that at least one of the one or more system parameters has changed;
    determining, by the controller, a second amount of power that would maximize the coefficient of performance of the thermoelectric module based on the one or more system parameters; and
    providing, by the controller, the second amount of power to the thermoelectric module.

2. The method of claim 1 wherein providing the first amount of power to the thermoelectric module comprises providing a first amount of current to the thermoelectric module and providing the second amount of power to the thermoelectric module comprises providing a second amount of current to the thermoelectric module.

3. The method of claim 1 wherein providing the first amount of power to the thermoelectric module comprises providing a first amount of voltage to the thermoelectric module and providing the second amount of power to the thermoelectric module comprises providing a second amount of voltage to the thermoelectric module.

4. The method of claim 3 wherein:
    the thermoelectric module is operative to reduce a temperature of a cooling chamber; and
    at least one of the group consisting of the first amount of power and the second amount of power is determined based on at least one of the group consisting of:
        the temperature of the cooling chamber;
        a temperature of a hot side of the thermoelectric module;
        a temperature of an environment that is external to the cooling chamber; and
        an electric property of the thermoelectric module such as the figure of merit.

5. The method of claim 4 wherein:
    determining the first amount of power comprises determining the first amount of power that would maximize the coefficient of performance of the thermoelectric module based on the temperature of the environment that is external to the cooling chamber;
    determining that at least one of the one or more system parameters has changed comprises determining that the temperature of the environment that is external to the cooling chamber has changed; and
    determining the second amount of power comprises determining the second amount of power that would maximize the coefficient of performance of the thermoelectric module based on the temperature of the environment that is external to the cooling chamber.

6. The method of claim 5 wherein providing the first amount of power to the thermoelectric module further comprises providing the first amount of power to one subset of more than one subset of thermoelectric modules and providing the second amount of power to the thermoelectric module further comprises providing the second amount of power to the one subset of the more than one subset of thermoelectric modules.

7. The method of claim 6 further comprising:
    determining, by the controller, that a temperature of a hot side of the thermoelectric module is above a first threshold; and
    providing an amount of power to the thermoelectric module that is less than the amount of power that would maximize the coefficient of performance of the thermoelectric module based on the one or more system parameters.

8. The method of claim 7 further comprising:
    determining, by the controller, that the temperature of the hot side of the thermoelectric module is below a second threshold; and
    providing, by the controller, an amount of power to the thermoelectric module that is the amount of power that would maximize the coefficient of performance of the thermoelectric module based on the one or more system parameters.

9. The method of claim 6 wherein providing the first amount of power to the thermoelectric module further comprises providing no power to another subset of the more than one subset of thermoelectric modules and providing the second amount of power to the thermoelectric module further comprises providing no power to another subset of the more than one subset of thermoelectric modules.

10. The method of claim 6 wherein providing the first amount of power to the thermoelectric module further comprises providing an amount of power to prevent heat leak to another subset of the more than one subset of thermoelectric modules and providing the second amount of power to the thermoelectric module further comprises providing an amount of power to prevent heat leak to another subset of the more than one subset of thermoelectric modules.

11. The method of claim 4 wherein:
determining the first amount of power comprises determining the first amount of power that would maximize the coefficient of performance of the thermoelectric module based on the temperature of the cooling chamber;
determining that at least one of the one or more system parameters has changed comprises determining that the temperature of the cooling chamber has changed; and
determining the second amount of power comprises determining the second amount of power that would maximize the coefficient of performance of the thermoelectric module based on the temperature of the cooling chamber.

12. The method of claim 4 wherein:
determining the first amount of power comprises determining the first amount of power that would maximize the coefficient of performance of the thermoelectric module based on the temperature of the hot side of the thermoelectric module;
determining that at least one of the one or more system parameters has changed comprises determining that the temperature of the hot side of the thermoelectric module has changed; and
determining the second amount of power comprises determining the second amount of power that would maximize the coefficient of performance of the thermoelectric module based on the temperature of the hot side of the thermoelectric module.

13. The method of claim 1 wherein the method is for operating the thermoelectric module in a thermoelectric refrigeration system operative to reduce a temperature of a cooling chamber, and
determining the first amount of power comprises determining the first amount of power that would maximize the coefficient of performance of the thermoelectric refrigeration system based on one or more system parameters comprising a temperature of an environment that is external to the cooling chamber; and
determining the second amount of power comprises determining the second amount of power that would maximize the coefficient of performance of the thermoelectric refrigeration system based on the one or more system parameters.

* * * * *